(12) United States Patent
Li et al.

(10) Patent No.: US 12,689,379 B2
(45) Date of Patent: ***Jul. 21, 2026

(54) COMPENSATION TECHNIQUE FOR THE NONLINEAR BEHAVIOR OF DIGITALLY-CONTROLLED OSCILLATOR (DCO) GAIN

(71) Applicant: Taiwan Semiconductor Manufacturing Company Limited, Hsinchu (TW)

(72) Inventors: Chao Chieh Li, Hsinchu City (TW); Min-Shueh Yuan, Taipei (TW); Robert Bogdan Staszewski, Dublin (IE); Chia-Chun Liao, Taipei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 39 days.

This patent is subject to a terminal disclaimer.

(21) Appl. No.: 18/660,325

(22) Filed: May 10, 2024

(65) Prior Publication Data

US 2024/0305302 A1     Sep. 12, 2024

Related U.S. Application Data

(63) Continuation of application No. 17/752,355, filed on May 24, 2022, now Pat. No. 11,996,852, which is a
(Continued)

(51) Int. Cl.
H03L 7/08          (2006.01)
H03B 5/04          (2006.01)
(Continued)

(52) U.S. Cl.
CPC ............. H03L 7/0802 (2013.01); H03B 5/04 (2013.01); H03B 5/1218 (2013.01);
(Continued)

(58) Field of Classification Search
CPC ...................................................... H03L 7/0802
(Continued)

(56) References Cited

U.S. PATENT DOCUMENTS 6,658,748 B1    12/2003  Leipold et al.
8,045,670 B2    10/2011  Waheed et al.
(Continued)

OTHER PUBLICATIONS

Staszewski, Robert, Leipold, Dirk, Muhammad, Khurram, Balsara, Poras; Digitally Controlled Oscillator (DCO)-Based Architecture for RF Frequency Synthesis in a Deep-Submicrometer CMOS Process; IEEE Transactions on Circuits and Systems—II: Analog and Digital Signal Processing, 50(11); pp. 815-828; Nov. 2003.
(Continued)

*Primary Examiner* — Joseph Chang
(74) *Attorney, Agent, or Firm* — Jones Day

(57)          ABSTRACT

Systems and methods are provided for hopping a digitally controlled oscillator (DCO) among a plurality of channels, wherein a gain of the DCO $K_{DCO}$ is a nonlinear function of frequency. A first normalized tuning word (NTW) corresponding to a first channel of the plurality of channels is generated. A first normalizing gain multiplier X is generated based on the nonlinear function of frequency, on an estimate of the nonlinear function of frequency, at a first frequency corresponding to the first channel. The first NTW is multiplied by the first X to obtain a first oscillator tuning word (OTW). The first OTW is input to the DCO to cause the DCO to hop to the first channel. A system for hopping among a plurality of channels at a plurality of respective frequencies comprises a phase-locked loop (PLL), a digitally controlled oscillator (DCO), a multiplexer, and an arithmetic module.

20 Claims, 15 Drawing Sheets

Related U.S. Application Data continuation of application No. 17/177,442, filed on Feb. 17, 2021, now Pat. No. 11,349,484, which is a continuation of application No. 16/851,452, filed on Apr. 17, 2020, now Pat. No. 10,931,285, which is a continuation of application No. 16/106,163, filed on Aug. 21, 2018, now Pat. No. 10,659,057.

(60) Provisional application No. 62/549,004, filed on Aug. 23, 2017.

(51) Int. Cl.
*H03B 5/12* (2006.01)
*H03L 7/093* (2006.01)
*H03L 7/099* (2006.01)

(52) U.S. Cl.
CPC ......... *H03B 5/1228* (2013.01); *H03B 5/1265* (2013.01); *H03B 5/1296* (2013.01); *H03L 7/093* (2013.01); *H03L 7/099* (2013.01); *H03L 7/0991* (2013.01); *H03B 2200/0072* (2013.01)

(58) Field of Classification Search
USPC .......................................................... 331/1 R
See application file for complete search history.

(56) References Cited

U.S. PATENT DOCUMENTS

| | | | |
|---|---|---|---|
| 10,659,057 | B2 | 5/2020 | Li et al. |
| 11,349,484 | B2 | 5/2022 | Li et al. |
| 2003/0050029 | A1 | 3/2003 | Kaufmann et al. |
| 2003/0107442 | A1 | 6/2003 | Staszewski |
| 2003/0133522 | A1 | 7/2003 | Staszewski et al. |
| 2003/0141936 | A1 | 7/2003 | Staszewski et al. |
| 2006/0033582 | A1* | 2/2006 | Staszewski ............. H03L 7/085 331/16 |
| 2012/0100821 | A1 | 4/2012 | Dan et al. |
| 2019/0068201 | A1 | 2/2019 | Li et al. |
| 2019/0305785 | A1 | 10/2019 | Chillara et al. |

OTHER PUBLICATIONS

Staszewski, Robert, Leipold, Dirk, Balsara, Poras; Just-In-Time Gain Estimation of an RF Digitally-Controlled Oscillator for Digital Direct Frequency Modulation; IEEE Transactions on Circuits and Systems—II: Analog and Digital Signal Processing, 50(11); pp. 887-892; Nov. 2003.

* cited by examiner

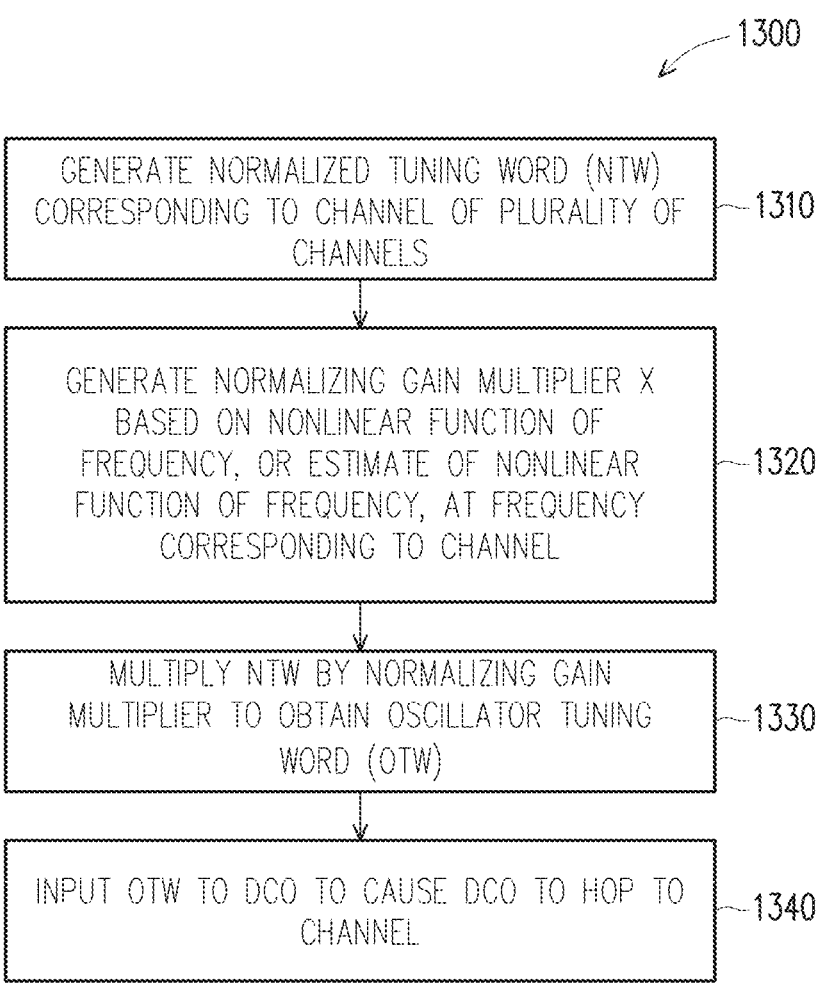

1300

GENERATE NORMALIZED TUNING WORD (NTW) CORRESPONDING TO CHANNEL OF PLURALITY OF CHANNELS ~1310

GENERATE NORMALIZING GAIN MULTIPLIER X BASED ON NONLINEAR FUNCTION OF FREQUENCY, OR ESTIMATE OF NONLINEAR FUNCTION OF FREQUENCY, AT FREQUENCY CORRESPONDING TO CHANNEL ~1320

MULTIPLY NTW BY NORMALIZING GAIN MULTIPLIER TO OBTAIN OSCILLATOR TUNING WORD (OTW) ~1330

INPUT OTW TO DCO TO CAUSE DCO TO HOP TO CHANNEL ~1340

FIG. 13

COMPENSATION TECHNIQUE FOR THE NONLINEAR BEHAVIOR OF DIGITALLY-CONTROLLED OSCILLATOR (DCO) GAIN

CROSS-REFERENCE TO RELATED APPLICATIONS

This application is a continuation application of U.S. patent application Ser. No. 17/752,355, filed on May 24, 2022, which is a continuation application of U.S. patent application Ser. No. 17/177,442, filed on Feb. 17, 2021, entitled "Compensation Technique for the Nonlinear Behavior of Digitally-Controlled Oscillator (DCO) Gain", now U.S. Pat. No. 11,349,484, issued on May 31, 2022, which is a continuation of U.S. patent application Ser. No. 16/851,452, filed on Apr. 17, 2020, entitled "Compensation Technique for the Nonlinear Behavior of Digitally-Controlled Oscillator (DCO) Gain", now U.S. Pat. No. 10,931,285, issued on Feb. 23, 2021, which is a continuation application of U.S. patent application Ser. No. 16/106,163, filed Aug. 21, 2018, entitled "Compensation Technique for the Nonlinear Behavior of Digitally-Controlled Oscillator (DCO) Gain", now U.S. Pat. No. 10,659,057, issued on May 19, 2020, which claims priority to U.S. Provisional Patent Application No. 62/549,004, filed on Aug. 23, 2017 and entitled "Compensation Technique for the Nonlinear Behavior of Digitally-Controlled Oscillator (DCO) Gain," which are incorporated herein by reference in their entireties.

FIELD

The technology described in this disclosure relates generally to digitally controlled oscillators (DCOs) and more particularly to the use of DCOs in phase locked loops (PLLs).

BACKGROUND

All-digital PLLs (ADPLLs) are widely used in advanced complementary metal-oxide-semiconductor (CMOS) based semiconductor devices. There they exploit the naturally fine resolution of voltage-controlled oscillators (VCOs), e.g., digitally-controlled oscillators (DCOs), thus reducing area and power dissipation versus analog PLLs.

BRIEF DESCRIPTION OF THE DRAWINGS

Aspects of the present disclosure are best understood from the following detailed description when read with the accompanying figures. It is noted that, in accordance with the standard practice of the industry, various features are not drawn to scale. In fact, the dimensions of the various features may be arbitrarily increased or reduced for clarity of discussion.

FIG. 13 depicts an example flow chart for calibrating DCO gain in accordance with some embodiments.

DETAILED DESCRIPTION

Figure 1A:
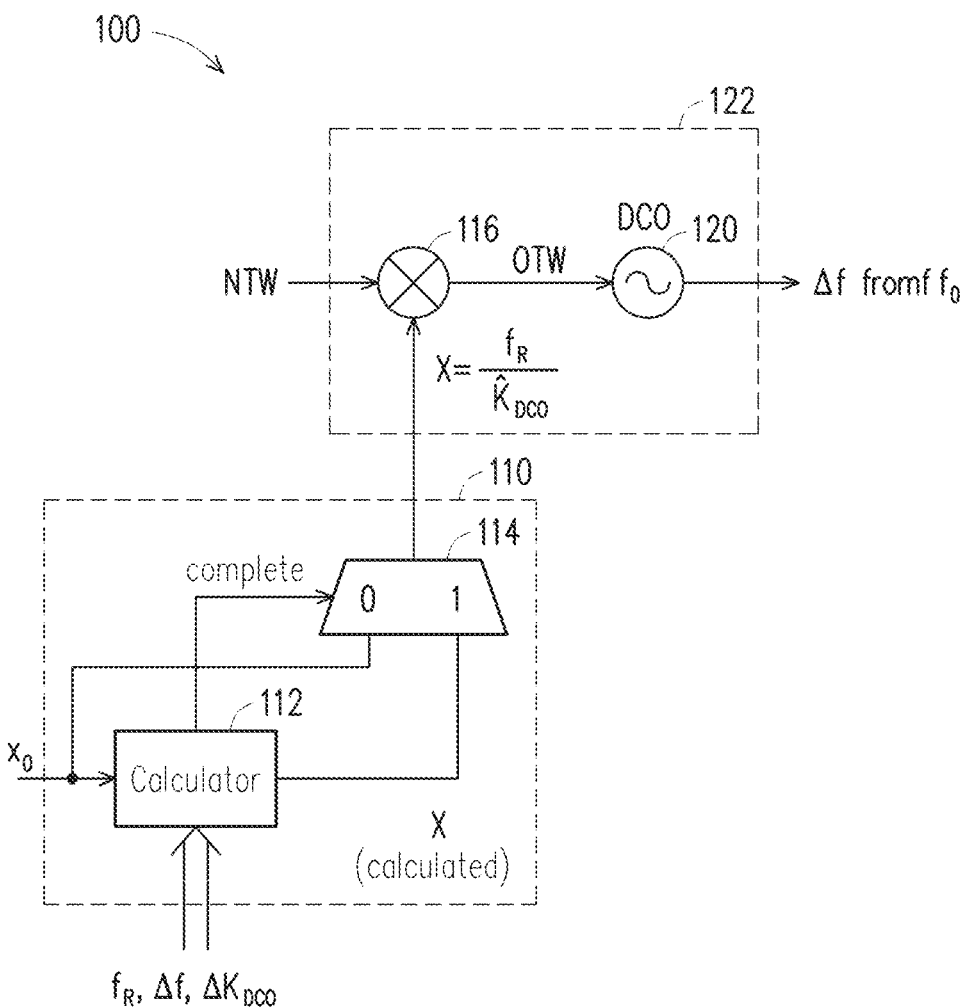
FIG. 1A depicts an example diagram of a just in time DCO gain calibration flow in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

DCOs can be implemented in a variety of forms. For example, an inductor-capacitor (LC) based DCO, which also can be referred to as an LC-tank, can achieve improved phase noise (PN) at lower power consumption, with low frequency pushing, and immunity from process and temperature variations. However, there is a strong non-linear behavior of the LC-based DCO across the overall tuning band. Such non-linearity can result in a potential stability issue and can increase uncertainty in the loop's behavior. In some embodiments, systems and methods described herein relate to techniques for compensating for the nonlinear behavior of digitally-controlled oscillator (DCO) gain and related systems and devices. Further embodiments describe interpolation based compensation techniques for the cubic behavior of DCO gain, and related systems and devices, such as center linear interpolation based compensation techniques, systems, and devices. For example, certain embodiments describe clock generation techniques, LC-tank oscillators (VCOs/DCOs), nonlinear oscillator gain, linear interpolation techniques, frequency hopping, and/or fast locking, and suitable combinations thereof.

Certain embodiments herein describe generating stable and finely tuned frequencies with a DCO, such as for use in generating clock signals in digital circuitry (e.g., in computer processors), generating frequency hopped signals such as for use in cellular communications, and the like. Certain embodiments describe a method for locking a phase locked loop (PLL), such as an all-digital PLL (ADPLL), to a frequency generated by a DCO that exhibits nonlinear gain as a function of frequency and thus otherwise may be difficult to lock to stably with a PLL. Certain embodiments provide one or more of the following advantages: the nonlinear behavior of DCO gain can be predicted and thus used to lock to the frequency of the DCO with a PLL without the need for measuring the frequency of the DCO at runtime, and hence provides one or more of (1) reduction of phase error when locking to the frequency of the DCO, (2) more rapid locking to the frequency of the DCO, (3) finer tuning to the frequency of the DCO, and (4) more stable generation of clock signals or communication frequencies.

The details of the example methods, systems, and devices of the present disclosure are described in the attached disclosure and drawings. It should be noted that the present technology is not limited to silicon based DCOs, nor to DCOs with cubic gain behavior, but also is applicable to DCOs based on other materials and/or with other nonlinear behavior.

FIG. 1A depicts an example diagram of a normalized DCO hardware abstraction layer in accordance with some embodiments. The DCO abstraction layer 100 can include a PLL, such as ADPLL 110, and a VCO, such as DCO 120, coupled to the PLL. The gain $K_{DCO}$ of DCO 120 can have nonlinear behavior, and ADPLL 110 can be configured so as to compensate for such nonlinear behavior. For example, it has been determined that within at least some ranges of frequency f, the $K_{DCO}$ of DCO 120 can vary as a cubic function of frequency f, and ADPLL 110 can be configured so as to generate a normalizing gain multiplier x that can be used to compensate for the nonlinear (e.g., cubic) behavior of the DCO gain $K_{DCO}$ in a manner such as provided herein. For example, ADPLL 110 can include gain estimation module 112 configured to calculate a normalizing gain multiplier x based on the $K_{DCO}$ and a reference frequency $f_R$ generated by the ADPLL in a manner such as described herein, multiplexer (MUX) 114 configured to select between the normalizing gain multiplier and an initial gain multiplier $x_0$ based on a calculation "complete" signal, and arithmetic module 116 configured to generate an oscillator tuning word (OTW) based on x. The ADPLL 100 can include an output (e.g., an output of arithmetic module 116) configured to provide the OTW to DCO 120, which generates a frequency based thereon with high accuracy and phase stability.

FIG. 1A shows a just-in-time DCO gain calibration flow according to some embodiments. In FIG. 1A, x means the DCO gain normalization value, NTW means the normalized tuning word, and OTW means the oscillator tuning word. The initial value $x_0$, is used for the OTW calculation in the beginning. Then the change in frequency Δf relative to an original locking frequency $f_0$, and the change in DCO gain $\Delta K_{DCO}$ can or will be injected into the gain estimation module (calculator) 112 to generate a normalizing gain multiplier x (calculated), which is provided to MUX 114. The MUX 114 selects between the initial value $x_0$ and the normalizing gain multiplier x based on a calculation "complete" signal. When the calculation is done, the new and correct normalization value x can or will replace the original $x_0$ value and can be multiplied by the NTW at arithmetic module 116 to obtain OTW which is input to the DCO 120. The DCO 120 will output a correct frequency after the correction, e.g., the cubic rule correction. The functionality of the arithmetic module 116 and the DCO 120 can be grouped together as 122.

Figure 7:
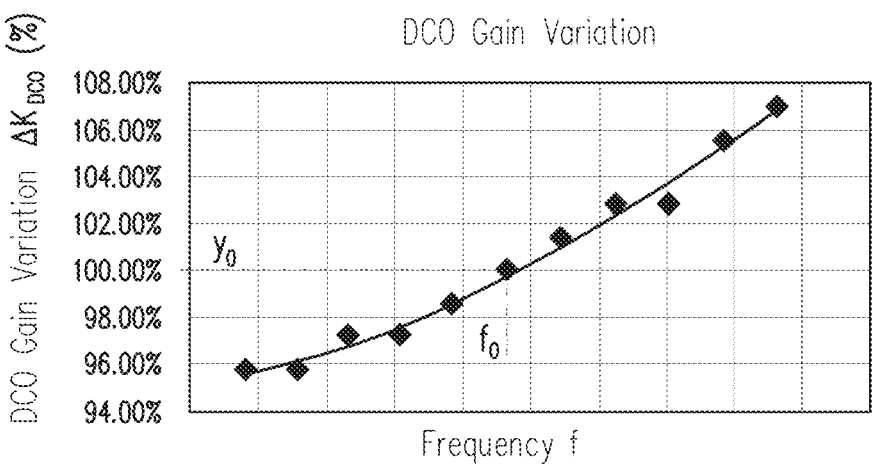
FIG. 7 depicts an example diagram of a plot of cubic rule of DCO gain variation versus oscillation frequency in accordance with some embodiments.

In some embodiments, a relationship that ties the frequency step $\Delta f^T$ of a DCO, such as DCO 120 illustrated in FIG. 1A having a DCO gain variation such as illustrated in FIG. 7, to the switchable capacitance $\Delta C^T$ of the DCO is governed by, or can be expressed as, equation (1):

$$\Delta f^T(f) = -2\pi^2 (L \cdot \Delta C^T) f^3 \tag{1}$$

in which L is the LC-tank inductance. Both L and $\Delta C^T$ are constants for a stable process, voltage, and temperature (PVT). In some embodiments, L and $\Delta C^T$ are the only unknowns and subject to the PVT variations on the right-hand side of the equation, so it can make sense to group them together as a product. The resonating frequency f is controlled by the total capacitance C of the LC-tank. f is known precisely (within a frequency control word (FCW) resolution—1.5 Hz/LSB) by virtue of the ADPLL loop operation.

Because $K_{DCO} = |\Delta f^T|$, equation (1) can be rewritten as equation (2):

$$K_{DCO}(f) = 2\pi^2 (L \cdot \Delta C^T) f^3 \tag{2}$$

Taking the derivative of $K_{DCO}$ with respect to frequency f results in equation (3):

$$\frac{dK_{DCO}(f)}{df} = 6\pi^2 (L \cdot \Delta C^T) f^2 = 3 \frac{K_{DCO}(f)}{f} \tag{3}$$

In some embodiments, the $K_{DCO}$ estimate, $\hat{K}_{DCO}$, is generated by gain estimation module 112 in a manner such as described elsewhere herein, and used in the ADPLL frequency synthesizer in the denominator of the DCO normalizing gain multiplier of value x, e.g., provided to MUX 114 for use in generating x based on $\hat{K}_{DCO}$ and the external reference frequency $f_R$ (which reference frequency can be generated by ADPLL 110) such as illustrated in FIG. 1A. In some embodiments, the value of gain multiplier x can be generated using equation (4):

$$x = f_R / \hat{K}_{DCO} = \frac{f_R}{2\pi^2 (L \cdot \Delta C^T) f^3} \tag{4}$$

Figure 1B:
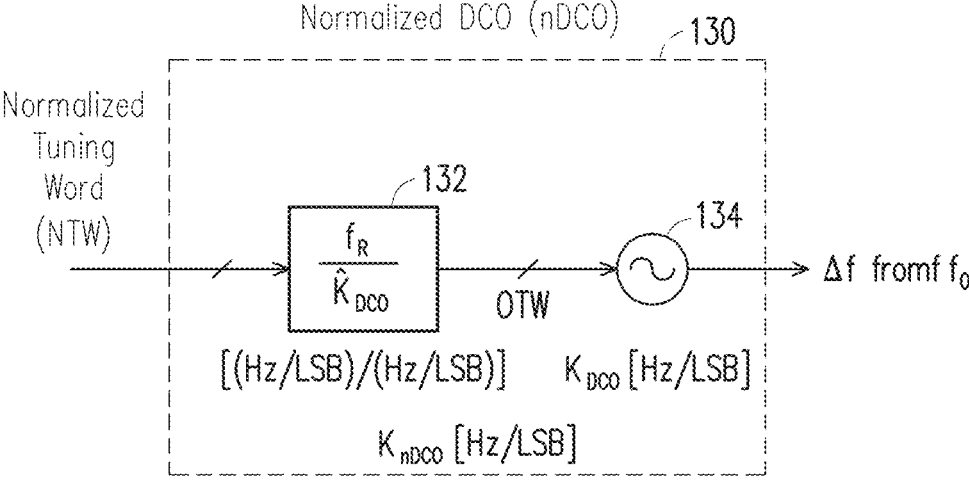
FIG. 1B depicts an example diagram of a normalized DCO hardware abstraction layer in accordance with some embodiments.

In some embodiments, an exemplary purpose of this is to conveniently decouple the phase and frequency information throughout the system from the PVT variations that normally affect the gain $K_{DCO}$ of the DCO 120. For example, the frequency information can be normalized to the value of external reference frequency $f_R$ using $\hat{K}_{DCO}$. Such normalization alternatively can be performed within the DCO, e.g., within a normalized DCO (nDCO) 130 such as illustrated in FIG. 1B, which depicts an example diagram of a just-in-time DCO gain calibration flow in accordance with some embodiments. Illustratively, in some embodiments, the digital input to the nDCO is a fixed-point normalized tuning word (NTW), whose integer part LSB can correspond to $f_R$. In some embodiments, $f_R/\hat{K}_{DCO}$ is a measure of the DCO gain estimation accuracy and affects precision of the frequency modulation. In some embodiments, the functionality of the arithmetic module 116 and the DCO 120, indicated by 122, can be represented by the nDCO 130, and more specifically by a DCO gain normalization module 132 and a DCO 134.

The normalizing gain multiplier x based on the estimated gain $\overline{K}_{DCO}$ can be expressed as $x=f_R/\hat{K}_{DCO}$, or alternatively a normalizing gain multiplier x based on the actual $K_{DCO}$ can be expressed as $x=f_R/K_{DCO}$. In either embodiment, the generation of x can be performed on a per-packet basis with a just-in-time method using dedicated hardware or software modules, e.g., gain estimation module 112 and MUX 114 such as illustrated in FIG. 1A. Even though the just-in-time method can be digital in nature (e.g., digital $\Delta f$ stimulus and/or digital OTW measured values), there can be a considerable amount of variance in measured OTW. In some embodiments, the measurement variance is lowered through averaging. In some embodiments, to save power consumption, a need arises to be able to measure $K_{DCO}$ over multiple packets.

To further reduce the design complexity of digital coding, the nonlinear (e.g., cubic) behavior of the DCO gain can be estimated using one or more linear functions, e.g., using linear interpolation. For example, in some embodiments taking the derivative of $x=f_R/K_{DCO}$ (e.g., based on the actual DCO gain $K_{DCO}$ rather than the estimated DCO gain $\hat{K}_{DCO}$) as a function of frequency results in equation (5):

$$\frac{dx}{df} = \frac{f_R}{2\pi^2(L \cdot \Delta C^T)} \cdot \frac{1}{f^3} \cdot \frac{-3}{f} \tag{5}$$

which could be conveniently written as equation (6):

$$\frac{dx}{df} = -\frac{3}{f} \cdot x \tag{6}$$

Equation (6) reveals that, in some embodiments, the DCO gain variation $\Delta K_{DCO}$ is roughly 3 times that of the frequency variation.

Figure 2:
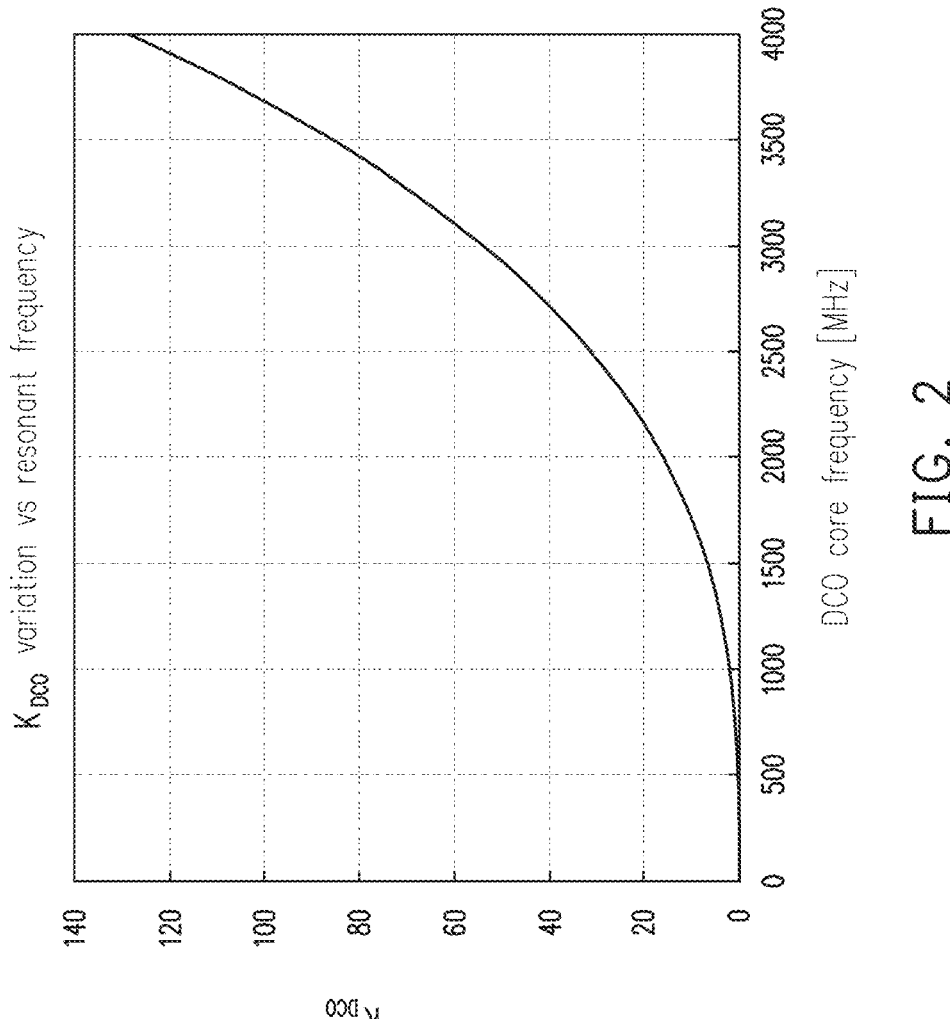
FIG. 2 graphically shows $K_{DCO}$ (f) over a wide frequency span from DC to the upper range of the core DCO frequency that is necessary to cover all GSM bands.

FIG. 2 graphically shows the cubic relationship in Eq. 2 over a wide frequency span from DC to the upper range of the core DCO frequency of 4000 MHz that is necessary to cover all GSM bands. The core DCO can operate at a multiple of a frequency used by an application that uses the core DCO. The frequency of the core DCO can be divided down to the frequency used by the application. For example, the core DCO operates at double the high-band GSM (1800 MHz and 1900 MHz) frequencies. In other frequency bands, the core DCO may operate at 4 times the frequency of the application that uses the core DCO. This allows for the core DCO to be operated in a broader range of frequencies.

Figure 3A:
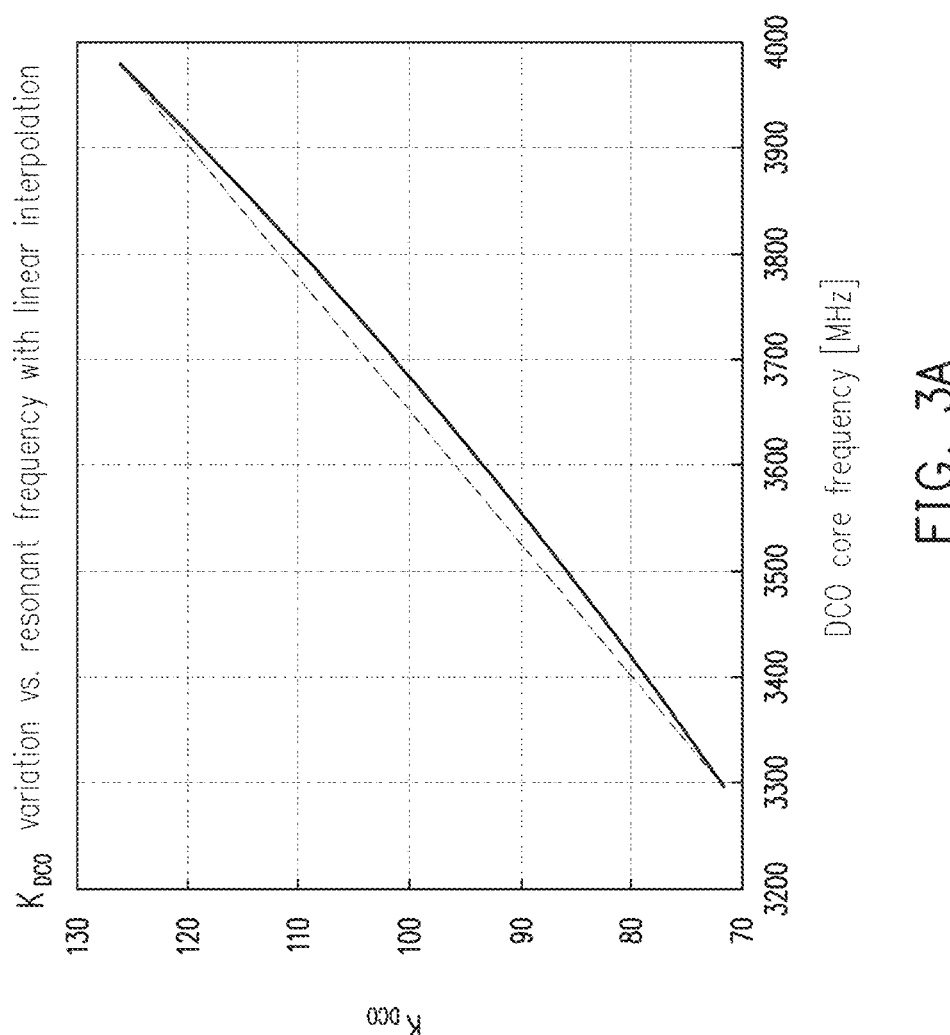
FIG. 3A graphically shows $K_{DCO}$ (f) over the frequency span covering four GSM TX and RX bands.

FIG. 3A graphically shows the cubic relationship in Eq. 2 over the frequency span covering four GSM TX and RX bands. The four GSM TX and RX bands include the 850

Figure 3B:
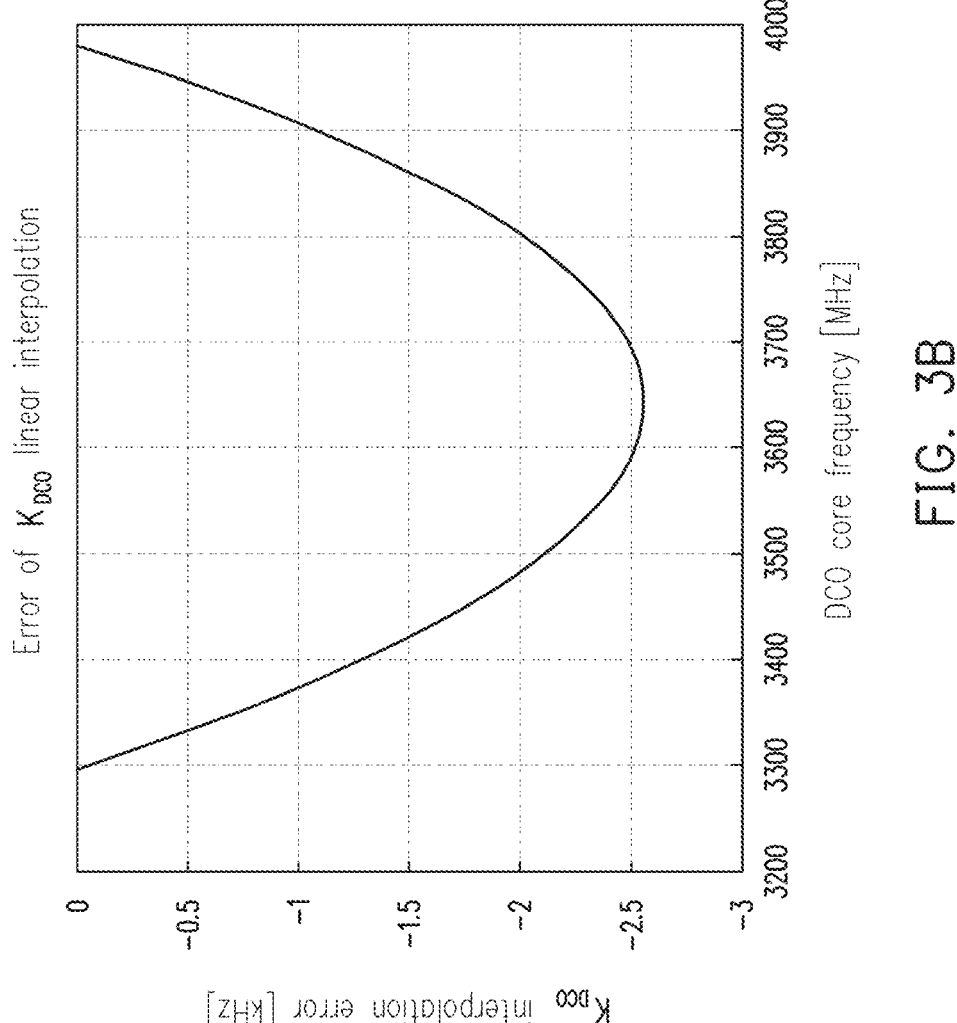
FIG. 3B depicts the interpolation error over the frequency span covering the four GSM TX and RX bands FIG. 4A graphically shows $K_{DCO}$ (f) over the frequency span covering the DCS-1800 band.

MHz, 900 MHz, 1800 MHz, and 1900 MHz bands. Also shown is a linear interpolation between the two extreme points in order to demonstrate the curvature extent over the entire frequency range. FIG. 3B depicts the interpolation error over the frequency span covering the four GSM TX and RX bands. The maximum $K_{DCO}$ interpolation error of 2.6% is too high for the linear interpolation that covers the entire GSM spectrum and is not shown in the graph.

Figure 4A:
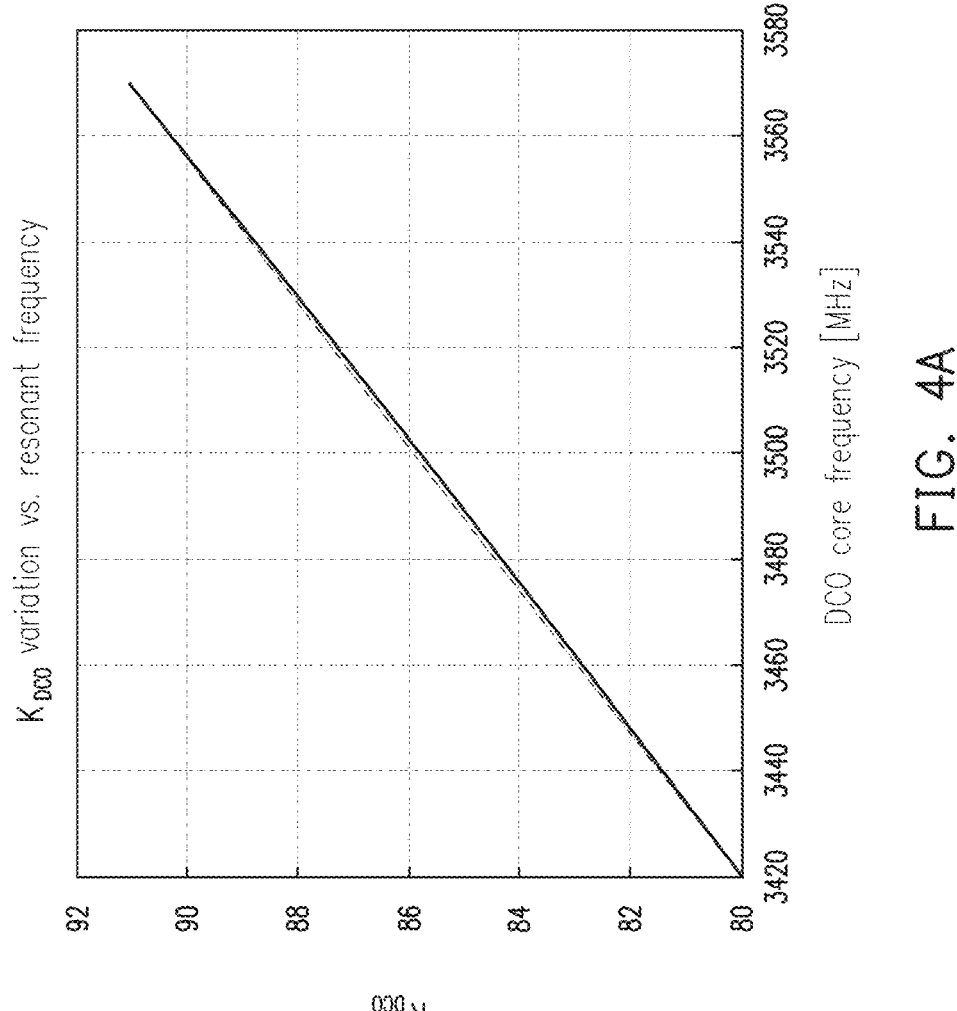
FIG. 4B depicts the interpolation error over the frequency span covering the DCS-1800 band.
Figure 4B:
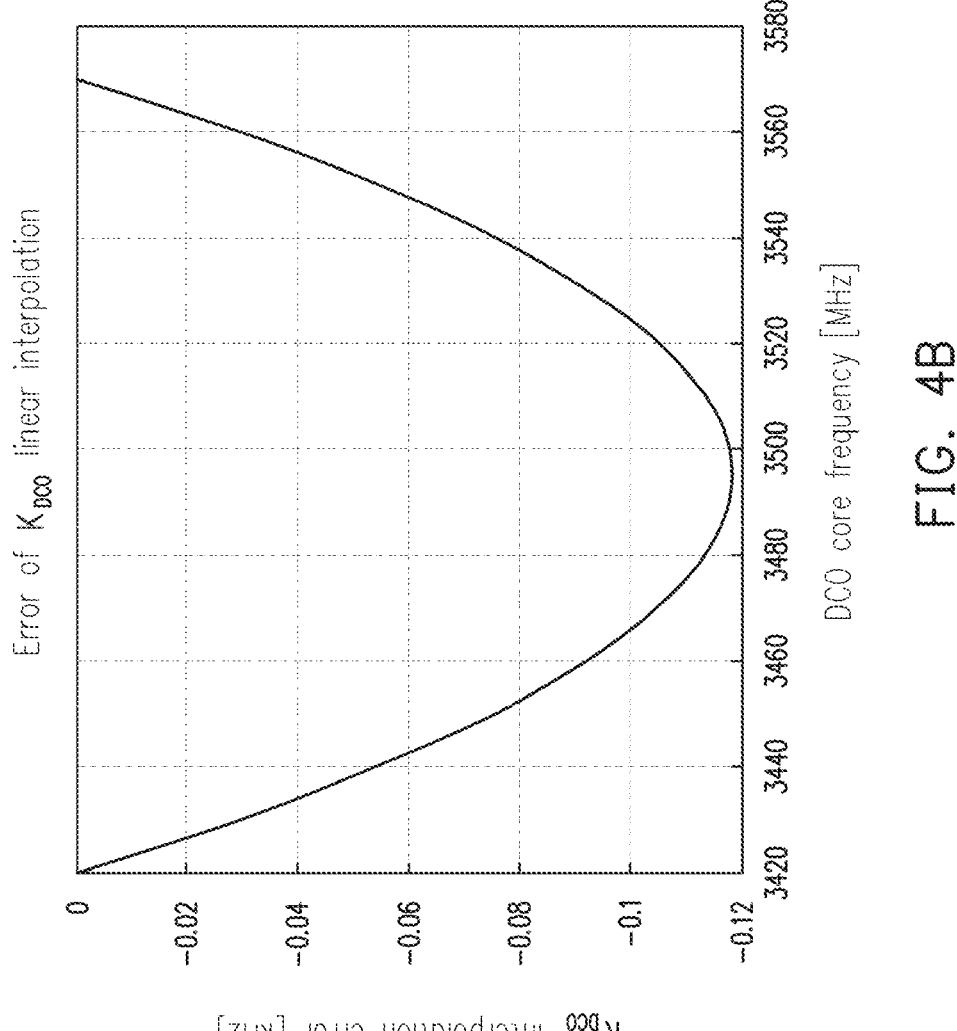

FIGS. 4A and 4B are similar to FIGS. 3A and 3B, but they cover the DCS-1800 band. FIG. 4B depicts the linear interpolation error as only 0.14%, so it seems feasible to be able to scale between the $K_{DCO}$ values within a single band.

Figure 5:
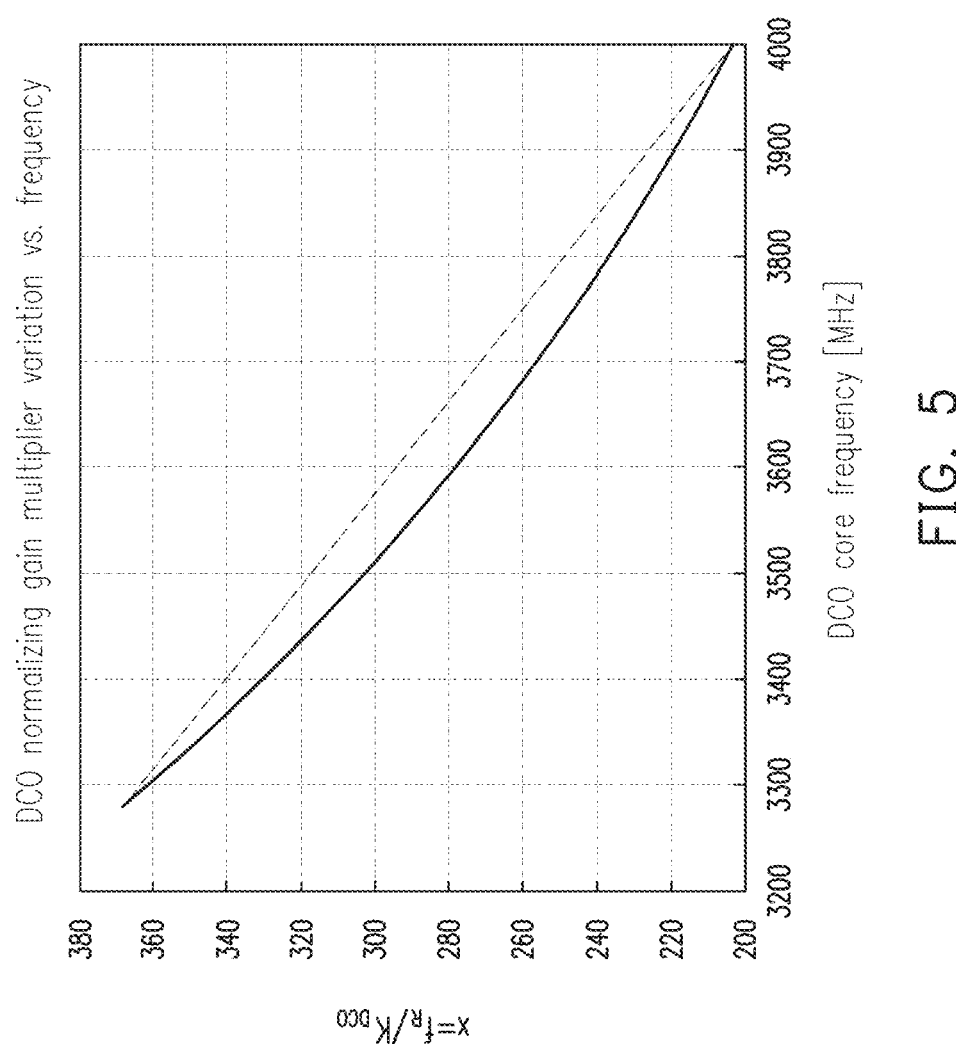
FIG. 5 depicts the inverse cubic relationship over the frequency span the covering four GSM TX and RX bands.

FIG. 5 depicts the inverse cubic relationship over the frequency span covering four GSM TX and RX bands, as well as the linear interpolation between the two extreme points in order to demonstrate the curvature extent over the entire frequency range.

Figure 6:
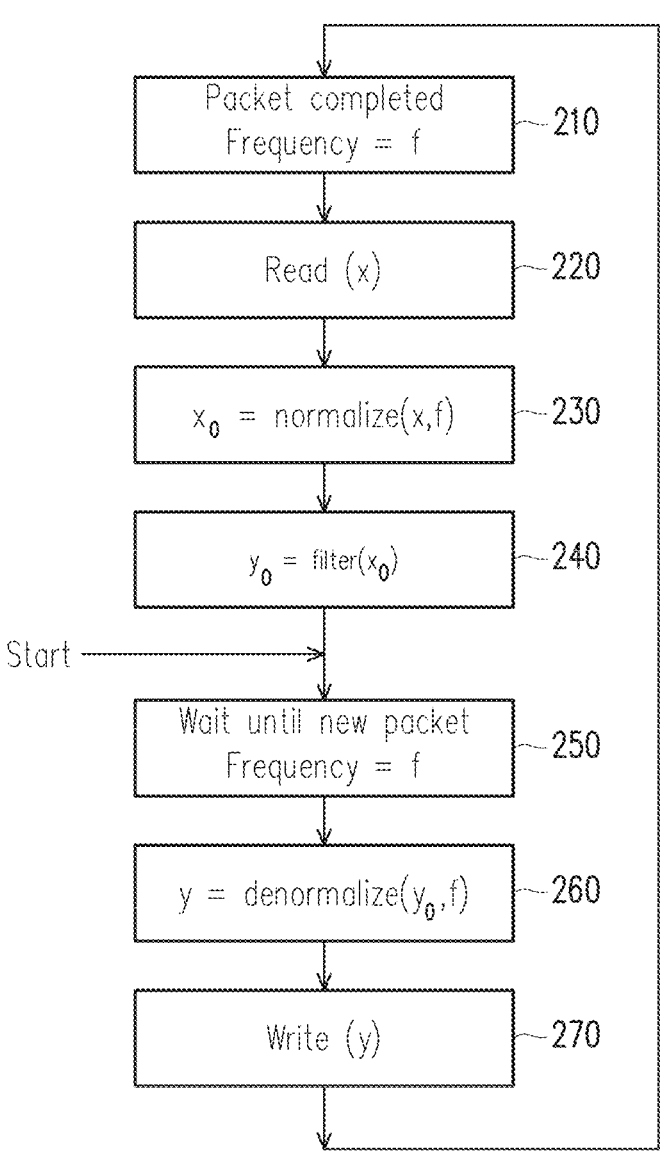
FIG. 6 depicts a flowchart of a proposed $K_{DCO}$ compensation algorithm.

FIG. 6 depicts a flowchart of a $K_{DCO}$ compensation algorithm. The $x=f_R/K_{DCO}$ estimates from packets at different frequencies can be frequency independent or normalized first by either the inverse cubic equation Eq. 4 or linear interpolation, as depicted in FIG. 6. At 210, the frequency of a completed packet is determined, and at 220, a value of x is determined. The normalized value of x can be represented by $x_o[k]$, where k is a sample index, and it corresponds to a certain frequency $f_0$, that preferably lies in the middle of a GSM band. The normalized value $x_o$ calculated at 230 based on linear interpolation is represented by equation (7):

$$x_0 = x + \frac{dx}{df}(f_0 - f) = x\left(1 - 3\frac{f_0 - f}{f}\right) \tag{7}$$

The term $y_0[k]$ is denormalized for the particular packet frequency f, such that y[k] could be used as the DCO gain multiplier. In this method the just-in-time calculated sample, as considered too noisy, is not immediately substituted for the normalizing gain multiplier, but rather it is input to the filtering algorithm. Then, the filtering is performed at 240 according to the equation of a "leaky integrator" in equation (8):

$$y_0[k] = (1 - \alpha) \cdot y_0[k-1] + \alpha \cdot x_0[k] \tag{8}$$

where $\alpha$ is a coefficient of a first-order infinite impulse response (IIR) filter and $y_0[k]$ is the filtered normalized value. For practical implementation reasons, $\alpha=2^{-\lambda}$ where $\lambda$ is an integer. This way, the multiplication by can be realized as a right bit shift operation.

At 250, the new packet frequency f is determined. The denormalization equation for the filtered multiplier y, calculated at 260, is shown in equation (9):

$$y = y_0 + \frac{dy_0}{df}(f - f_0) = y_0\left(1 - 3\frac{f - f_0}{f_0}\right) \tag{9}$$

In equation (9), y corresponds to $\Delta K_{DCO}$, $f_0$ corresponds to the frequency at which the gain variation is 100%, and $y_0$ corresponds to the value of $\Delta K_{DCO}$ at which the gain variation is 100%. At 270, the calculated value of y is written and/or output as the DCO gain multiplier.

FIG. 7 depicts an example diagram of a plot of cubic rule of DCO gain variation versus oscillation frequency f in accordance with some embodiments. FIG. 7 shows the DCO gain variation of the post-simulation value include parasitic (RC) extraction and inductance after electromagnetic (EM) simulation. The diamonds indicate simulated gain of the DCO at selected frequencies, and the solid curve indicates a polynomial fit to the simulated gain. It has been found that in some embodiments, the curve could be approximately represented by a third-order polynomial (e.g., as $Y=aX^3+bX^2+cX+d$), that is, as a cubic function of frequency, with high correlation. In some embodiments, the DCO frequency is operated doubled at the Bluetooth band (e.g., operated at around 4.8 GHz and the frequency then halved to around 2.4 GHz, so as to use smaller components than may be needed to generate frequencies directly in the Bluetooth band). For example, the nonlinear DCO gain variation can be in the GHz band.

Figure 8:
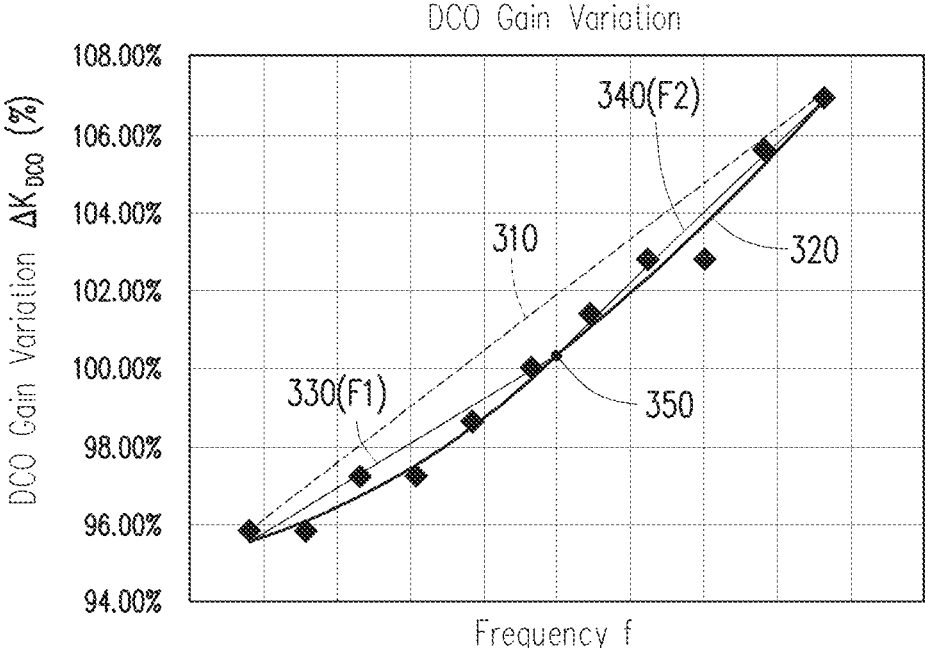
FIG. 8 depicts an example diagram of a plot of use of a linear interpolation from the center of the curve in accordance with some embodiments.

The reduced digital design can benefit from the reduction from a cubic polynomial to a linear equation. For example, FIG. 8 depicts an example diagram of a plot of use of a linear interpolation from the center of a curve in accordance with some embodiments. FIG. 8 shows an exemplary embodiment of the DCO gain variation with the linear interpolation from equation (9) in the dotted line 310, the simulated gain of the DCO in diamonds (corresponding to the diamonds illustrated in FIG. 7), and the cubic fit of the DCO gain in the solid curved line 320 (corresponding to the curve illustrated in FIG. 7). In this exemplary embodiment, the solid curved line 320 can be represented by $y=-6.5668x^3+98.228x^2-488.77x+810.12$. In some embodiments, such linear interpolation will or can result in a relatively large predicted error due to the cubic nonlinear curve of DCO gain in the middle of the operation frequency. Thus, in some embodiments, a different linear equation formula(e) can be used, e.g., a center linear interpolation such as shown in the straight, solid lines 330, 340 illustrated in FIG. 8, so as to reduce the prediction error. In some such configurations, there can be two equations F1 (corresponding to line 330) and F2 (corresponding to line 340) that each are the same as equation (9) with a different parameter $y_0$ before $(f-f_0)/f_0$. For example, in an exemplary embodiment, in F1 the value of $y_0$ can be changed from 3 to 2.8 (or other suitable value) and/or in F2 the value of $y_0$ can be changed from 3 to 3.3 (or other suitable value). It should be appreciated that the particular values of $y_0$ can depend on the center point of the curve (corresponding to point 350 in FIG. 8) and the cubic effect, and that the value of $y_0$ in F1 and F2 is not limited to being larger or smaller than the original value of $y_0$. Additionally, or alternatively, it should be appreciated that if the cubic polynomial is not in the nonlinear portion of the curve, a linear interpolation from the start to the end (such as line 310 illustrated in FIG. 8) could also satisfy the accuracy appropriately for the system design. Additionally, or alternatively, it should be appreciated that the middle point 350 of the solid, straight lines 330, 340 is not limited to the center of the operation band, but instead could be adjusted by the system design and design complexity.

Figure 9:
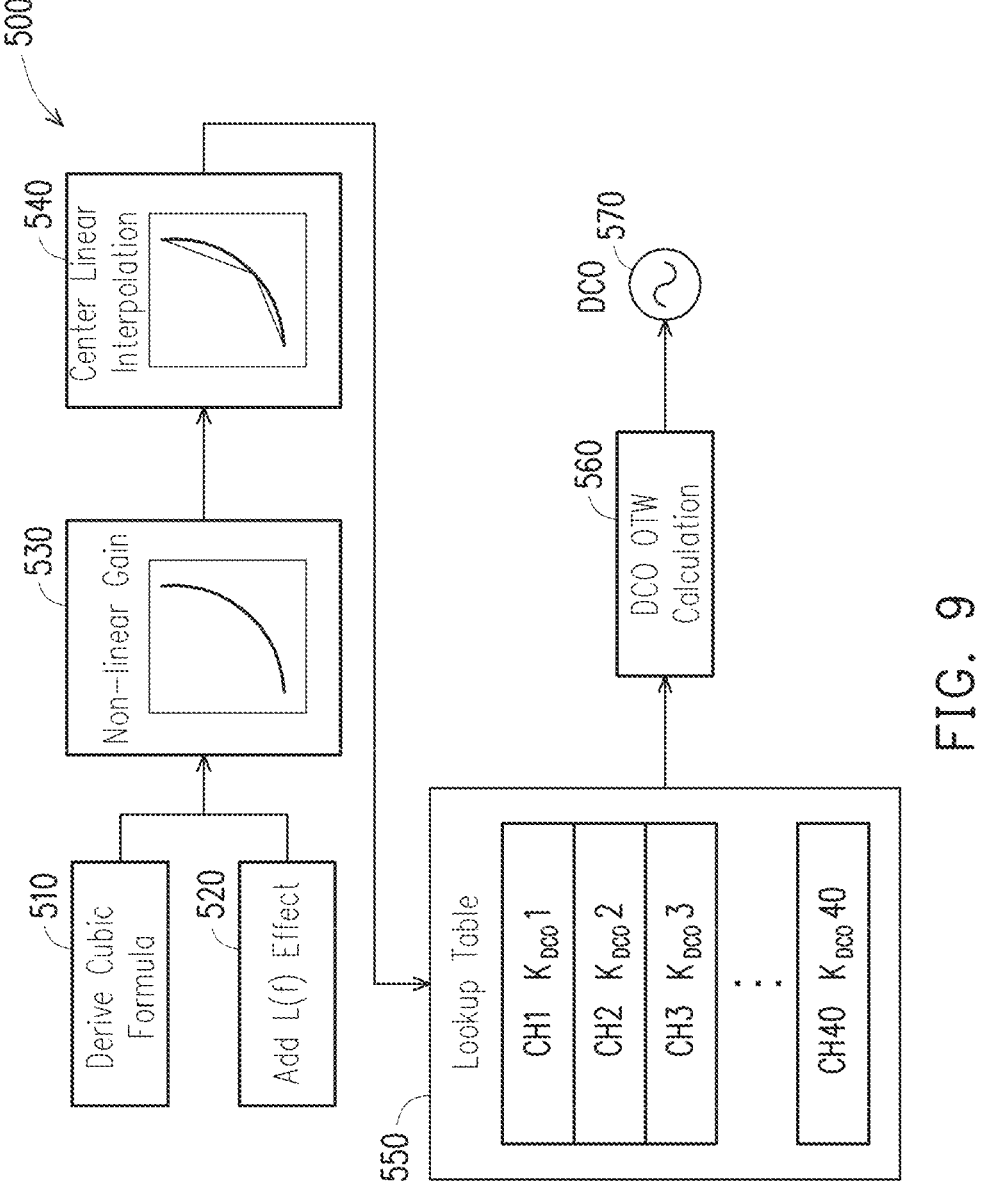
FIG. 9 depicts an example diagram of a completed DCO gain calibration flow for channel hopping in accordance with some embodiments.

FIG. 9 depicts an example diagram of a completed DCO gain calibration flow for channel hopping in accordance with some embodiments. For example, FIG. 9 shows the detail of an exemplary implementation provided herein. The cubic formula is derived in the beginning (operation 510), e.g., such as described herein with reference to equation (1). The inductance L(f) effect optionally can be added (operation 520). For the restricted resolution, the inductance variation can be taken into account, however, the inductance L(f) is not limited to add in the flow (e.g., is not required), because it can be a relatively minor influence on operation frequency.

After deriving non-linear gain of the DCO (operation 530), a linear interpolation could be used to reduce the frequency error (operation 540), e.g., a center linear interpolation such as described herein with reference to equation (7) and FIG. 8. For example, in some embodiments there will be two formulas (F1,F2) in the upper band and lower band, but it should be appreciated that it is not limited to two only. For the more precise prediction, there could be several formulas to mimic the real nonlinear (e.g., cubic) rule. If the design complexity is not a concern, the linear interpolation could also be skipped. The pure nonlinear (e.g., cubic) polynomial could be embedded into the system.

Because the gain of the DCO varies nonlinearly as a function of frequency, the value of $\hat{K}_{DCO}$ used to compensate for such nonlinearity similarly can change as a function of frequency. Accordingly, in each different channel (frequency band) to be generated by the DCO, there may be a difference in the DCO gain for use in generating the linear formulas (F1,F2). In some embodiments, $\hat{K}_{DCO}$ could be calculated by adopting the $\Delta f$ into the equation. Alternatively, the different values of DCO gain, $KDCO_1 \ldots KDCO_N$ could be stored in a lookup table and selected based on the channel (frequency band) selection (operation 550). For example, when the system receives a channel hopping (frequency changing/frequency locking) request, the DCO OTW calculator may use the lookup table to obtain the corresponding DCO gain to achieve the accurate output frequency and to generate an OTW based thereon (operation 560) which is provided to the DCO (operation 570) for use in generating a frequency by the DCO, for example, twice the desired frequency used by the application $f_{ckv}$ as shown in FIG. 10A.

In certain embodiments herein, the predicted DCO gain can be close to the actual silicon behavior, which can significantly reduce the phase error in the ADPLL at the beginning of the phase locking process. So this technique could also help to improve the locking time and settling time.

Figures 10A, 10B, 10C, 10D, 10E:
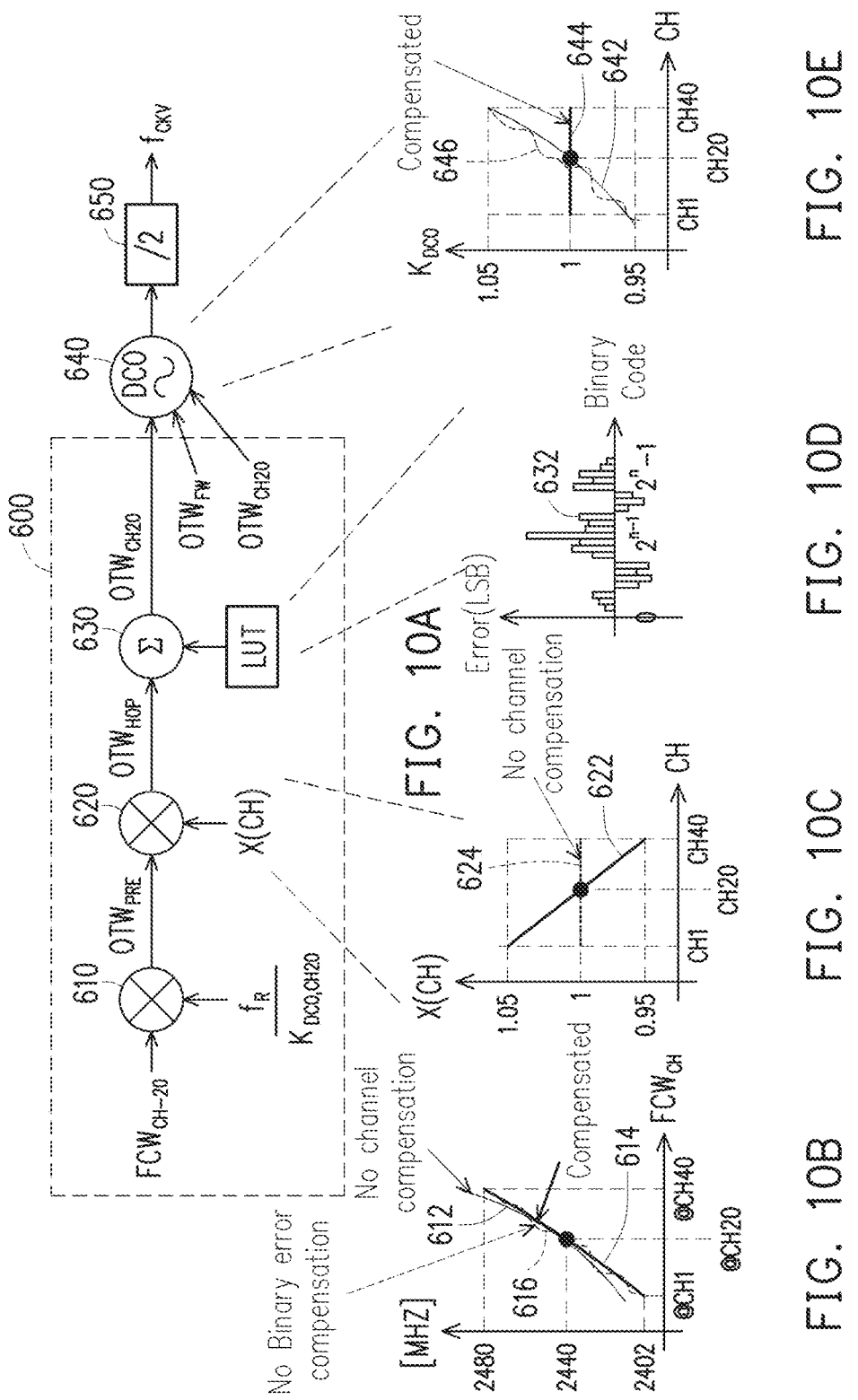
FIG. 10A depicts an example diagram of PLL and DCO hardware in accordance with some embodiments.
FIGS. 10B-10E depict example diagrams of plots of signals at different locations in the PLL and DCO hardware of FIG. 10A in accordance with some embodiments.

FIG. 10A depicts an example diagram of PLL and DCO hardware in accordance with some embodiments, and FIGS. 10B-10E depict example diagrams of plots of signals or operations at different locations in the PLL and DCO hardware of FIG. 10A in accordance with some embodiments. In the example shown in FIG. 10A, a multiple-stage compensation for gain nonlinearity of DCO 640 can be performed by PLL 600 (such as an APDLL). For example, at a first stage an arbitrary channel CH, here CH20 (Channel 20 at frequency $f_{CH20}$), is used as the center point, and a frequency control word (FCW) generated by PLL 600 at this channel frequency is input to first arithmetic module 610, such as a first multiplier module. Additionally, a first compensation factor for the arbitrary channel is generated by PLL 600 and input to the first arithmetic module 610. For example, the first compensation factor can be or include normalization of $K_{DCO}$ (DCO gain) at the arbitrary channel CH, e.g., CH20. Note that $K_{DCO,CH20}$ can be known exactly, e.g., by calibrating the DCO. The PLL 600 can include modules for generating $x(CH)=f_R/K_{DCO,CH}$ for CH20 (such as a gain estimation module and multiplexer) in a manner similar to that described herein with reference to FIG. 1A. Arithmetic module 610 of PLL 600 can be configured so as to multiply $FCW_{CH20}$ by the normalizing gain multiplier x(CH20) to obtain a preliminary OTW, referred to in FIG. 10A as $OTW_{PRE}$. As shown in FIG. 10B, line 612 represents the DCO frequency without channel (cubic) compensation, line 614 represents the DCO frequency with channel compensation such as applied by arithmetic modules 610 and 620, and line 616 represents the DCO frequency without binary error compensation such as described further below.

Arithmetic module 620 of PLL 600 illustrated in FIG. 10A can be configured so as to compensate for the nonlinear control word. For example, the gain $K_{DCO}$ of the DCO at a given frequency (channel) can be expressed using equation (2) above, and the derivative of $K_{DCO}$ at that frequency (channel) can be expressed using equation (3) above. In the example shown in FIG. 10A, for a particular channel CH, the estimated gain $\hat{K}_{DCO}$ for that channel can be expressed as:

$$\hat{K}_{DCO}(CH) = \left(K_{DCO,CH20}1 + 3\frac{f_{CH} - f_{CH20}}{f_{CH20}}\right) \quad (8)$$

and the normalizing gain multiplier x(CH) for that channel can be expressed as:

$$x(CH) = \frac{1}{\left[1 + 3^{(f_{CH} - f_{CH20})}/_{f_{CH20}}\right]} \quad (9)$$

Arithmetic module 620 (e.g., multiplier module) can be configured to multiply $OTW_{PRE}$ by x(CH) so as to generate output $OTW_{HOP}$ for the particular hopped frequency at channel CH. As shown in FIG. 10C, such an operation can result in a substantially linear estimated DCO gain (line 622), as compared to a flat DCO gain without channel compensation (line 624).

Arithmetic module 630 of PLL 600 illustrated in FIG. 10A (e.g., summation module) is configured can be configured so as to transform OTW HOP into binary code, depicted in graph 632 in FIG. 10D, and to compensate for any nonlinearities in the binary control using a look-up table (LUT) storing frequency-dependent binary error (LSB) in a manner such as illustrated in FIG. 10C. The output of third arithmetic module 630 at an arbitrary channel, e.g., $OTW_{CH}$ for CH20 or other suitable channel which can correspond to a normalized FCW, can be provided at an output of PLL 600 and then input to DCO 640. After compensations such as performed by arithmetic modules 610, 620, and 630 of PLL 600, the FCW input to DCO 640 will be substantially linear to the channel and the gain $K_{DCO}$ will be substantially a constant over all channels. As shown in FIG. 10E, the DCO gain $K_{DCO}$ across the range of channels CH1 to CH40. Line 642 corresponds to DCO gain without channel compensation, line 646 corresponds to DCO gain without binary error compensation, and line 644 corresponds to the DCO gain after compensation.

In one exemplary implementation, the channels CH and CH20 are at double the Bluetooth band, and the output of DCO 640 is input to an arithmetic module 650 (e.g., a module configured to divide the DCO output by 2), so that PLL 600 and DCO can have relatively small modules as compared to the size of modules that may be needed to directly generate a DCO output within the Bluetooth band. The desired Bluetooth frequency is represented by $f_{ckv}$.

Figure 11:
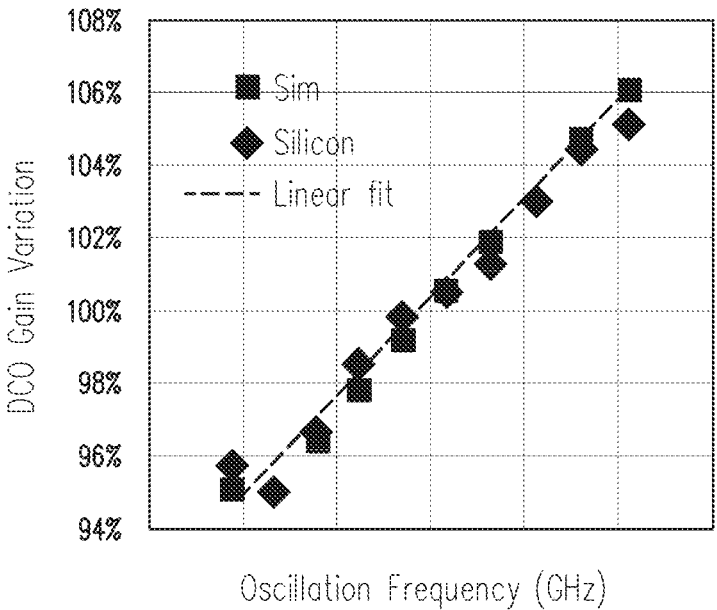
FIG. 11 depicts an example diagram of a plot of DCO gain variation versus oscillation frequency in accordance with some embodiments.

FIG. 11 depicts an example diagram of a plot of DCO gain variation versus oscillation frequency in accordance with some embodiments. In FIG. 11, it can be seen that the gain variation of a simulated DCO (squares) is relatively close to the measured gain variation of a silicon DCO (diamonds), and that both of which gain variations are approximately linear (dashed line).

Figure 12:
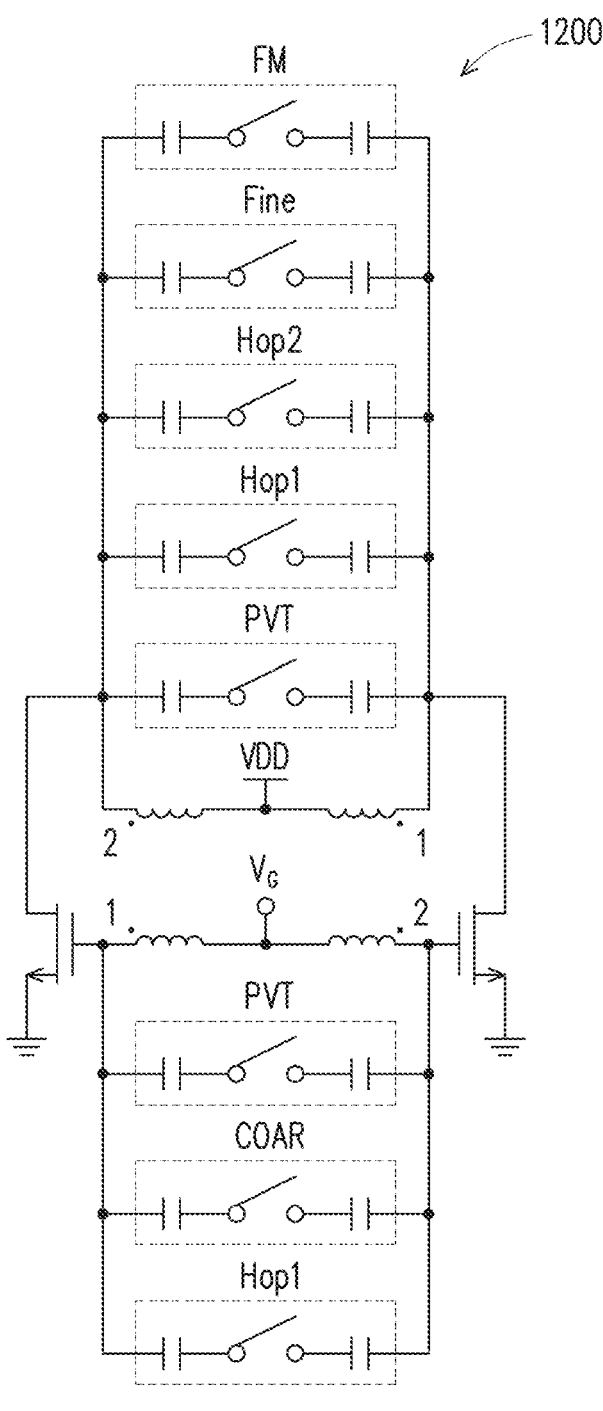
FIG. 12 depicts an example diagram of DCO hardware for channel hopping in accordance with some embodiments.

FIG. 12 depicts an example diagram of a DCO circuit 1200, e.g., the DCO circuit 120 or the DCO circuit 640, for channel hopping in accordance with some embodiments. The DCO circuit 1200 of FIG. 12 is transformer coupled and has five switched-capacitor (sw-cap) tuning banks: PVT, COAR and FINE for the PLL loop locking, as well as HOP and FM for the 2-point modulation. For example, the FM bank can be used for GFSK modulation. The HOP1/HOP2 bank could cover the channel hopping frequency for the zero hopping time. The transformer turns ratio N=2 and coupling coefficient (k=0.74) can be designed to provide a passive voltage gain from the drain to gate sides of the transconductor pair, thus boosting the loop gain by 50% and improving the start-up at a lower supply of 0.23 V. The PVT bank can be unit-weighted and can provide relatively large 10.2 MHz steps. The PVT bank can be split into the transformer's primary (1) and secondary (2) to achieve the max Q-factor enhancement. To ensure sufficient coverage in each tuning bank, in some embodiments the COAR bank has a step size of 0.48 MHz and the FINE bank has the finest resolution (e.g., 16 kHz) so as to eliminate the need for power-hungry DCO dithering. To achieve the finest resolution, the FINE bank can be connected to the primary coil so to benefit from the capacitance transformation of $1/N^2$. In one exemplary embodiment, the FM sw-cap bank can include 128 unit-weighted 16 kHz units so as to cover the ±250 kHz GFSK modulation range. Exemplary characteristics of components of the DCO hardware of FIG. 12 are listed in the following table:

| | | |
|---|---|---|
| FM | 128 b | Unit-weighted |
| Fine | 128 b | Unit-weighted |
| COAR | 128 b | Unit-weighted |
| PVT | 32 b | Unit-weighted |
| HOP1 | 8 b | Binary-weighted |
| HOP2 | 8 b | Binary-weighted |

An OTW, e.g., the OTW in the DCO circuit 120 or the DCO circuit 640, may comprise the inputs to the exemplary DCO circuit 1200 listed in the above table, including FM, Fine, COAR, PVT, HOP1, HOP2.

FIG. 13 depicts an example flow chart for calibrating DCO gain in accordance with some embodiments. While the process of FIG. 13 is applicable to many different systems and devices, it is described with reference to FIGS. 1 and 6A for ease of understanding. Flow chart 1300 includes an operation of generating a normalized tuning word (operation 1310). For example, ADPLL 110 illustrated in FIG. 1A or PLL 600 illustrated in FIG. 10A can include suitable module (s) for generating a normalized tuning word (NTW), which can be referred to as a frequency control word (FCW).

Flow chart 1300 also includes an operation of generating a normalizing gain multiplier based on the reference frequency and an interpolation of the nonlinear function of frequency of the DCO gain (operation 1320). For example, ADPLL 110 illustrated in FIG. 1A or PLL 600 illustrated in FIG. 10A can include suitable module(s) for generating the normalizing gain multiplier x based on the gain $K_{DCO}$ and the reference frequency $f_R$, such as MUX 114 of ADPLL 110 illustrated in FIG. 1A or a suitable module coupled to second arithmetic module 620 of PLL 600 illustrated in FIG. 10A.

Flow chart 1300 also includes an operation of multiplying a normalized tuning word (NTW) by the normalizing gain multiplier x to obtain an oscillator tuning word (operation 1330). For example, ADPLL 110 illustrated in FIG. 1A or PLL 600 illustrated in FIG. 10A can include suitable module(s) for multiplying NTW by x to obtain OTW, such as arithmetic module 116 of ADPLL 110 illustrated in FIG. 1A or second arithmetic module 620 of PLL 600 illustrated in FIG. 10A.

Flow chart 1300 also includes an operation of inputting the OTW to the DCO to cause the DCO to hop to a channel (operation 1340). For example, ADPLL 110 illustrated in FIG. 1A or PLL 600 illustrated in FIG. 10A can be coupled to a DCO so as to provide the OTW to the DCO which is configured to generate the desired frequency based on the OTW, such as DCO 120 illustrated in FIG. 1A or DCO 640 illustrated in FIG. 10A.

Note that any suitable combination of modules provided herein suitably can be integrated with or coupled to the PLL or the DCO as appropriate. For example, any suitable combination of some or all of the gain estimation module, multiplexer, and arithmetic module mentioned with reference to FIG. 9 can be provided as part of the DCO rather than as part of the PLL, or can be provided as part of a distinct device coupled between the PLL and the DCO. Illustratively, the normalized DCO illustrated in FIG. 1B is configured so as to receive an NTW from a PLL (not shown) and includes module(s) configured so as to perform DCO gain normalization such as provided herein and output an OTW to the DCO for use in generating a desired frequency. Additionally, note that modules provided herein can be implemented using any suitable combination of hardware and software, e.g., can be provided by a suitably programmed field-programmable gate array (FPGA) or application-specific integrated circuit (ASIC) and/or can be provided by a suitably programmed computer.

Under one exemplary aspect provided herein is derived a nonlinear DCO gain behavior as a cubic function of oscillation frequency. For example, in some embodiments the DCO gain will increase cubically as the oscillation frequency increases. The present disclosure, among other things, shows that this nonlinear behavior is predictable and independent of the process, voltage and temperature (PVT) variation. Based on derivation of this nonlinear (e.g., cubic) gain, for example based on a center linear interpolation, the free run DCO frequency could be substantially or exactly achieved without the need for measurement of the gain. Under another exemplary aspect provided herein, a linear approach to mimic the silicon behavior is not enough for the finest resolution application. For example, a interpolation from center of the curve could greatly improve the predicted error between silicon and simulation behavior. Under another exemplary aspect provided herein, the present approach could be implemented for any type of DCO in the fast locking applications. For example, it could help to minimize the phase error in the beginning of locking progress.

Accordingly, a derived cubic rule of the nonlinear behavior of DCO gain is provided. A linear interpolation could help to get an accurate DCO gain with less complexity of design. A center linear interpolation technique further can improve the DCO gain. A "just in time" DCO gain calibration flow can include use of a calculator output a final normalized DCO gain, a multiplexer (mux) configured to select the right normalized DCO gain, and a multiplier configured to change the NTW to OTW when the calculation is completed. Typically, "calibration" implies that a series of steps that have been performed prior to the operation of hardware. However, the term "just in time calibration" is used here to describe a calibration-type process that can be performed during the operation of the hardware and "just in time" for the outputs to be generated. A completed DCO gain calibration flow for channel hopping (frequency band selection) can include use of a derived cubic formula, a inductance effect to the frequency, a non-linear DCO gain curve, a center linear interpolation equation, a lookup table, an OTW calculator, and a DCO. It could be adopted in any frequency hopping, fast locking and frequency prediction application. The calibration could be combined with any other type of DCO gain/frequency calibration, for example linear calibration (binary errors). The DCO design could be any type of LC-tank oscillator, for example inductors and/or transformers. The capacitor bank is not limited to the example and the combination is not limited to binary controlled or unit-weighted. The DCO gain after compensation can in be the same overall frequency range. The DCO frequency curve can be linear to the oscillation frequency after compensation.

In one embodiment, a method is provided for controlling a digitally controlled oscillator (DCO). A first normalized tuning word (NTW) corresponding to a first channel of the plurality of channels is generated. A first normalizing gain multiplier X is generated based on the nonlinear function of frequency, on an estimate of the nonlinear function of frequency, at a first frequency corresponding to the first channel. The first NTW is multiplied by the first X to obtain a first oscillator tuning word (OTW). The first OTW is input to the DCO to cause the DCO to hop to the first channel.

In another embodiment, a system is provided for controlling a digitally controlled oscillator (DCO). The system comprises: a phase-locked loop (PLL) is configured to generate a plurality of normalized tuning words, each NTW corresponding to a respective channel of the plurality of channels; a DCO having a gain that is a nonlinear function of frequency; a multiplexer configured to generate a plurality of normalizing gain multipliers X, each X being based on a reference frequency $f_R$ and the nonlinear function of frequency, or an estimate of the nonlinear function of frequency, at a respective frequency of a channel of the plurality of channels; and an arithmetic module configured to generate a plurality of oscillator tuning words (OTWs) based on a respective NTW and a respective X, wherein the DCO hops among the channels based on respective OTWs of the plurality of OTWS.

In yet another embodiment, a normalized digitally controlled oscillator (nDCO) comprises: a digitally controlled oscillator (DCO) having a gain that is a nonlinear function of frequency; a multiplexer configured to generate a plurality of normalizing gain multipliers X, each X based on a reference frequency $f_R$ and the nonlinear function of frequency, or an estimate of the nonlinear function of frequency, at a respective frequency of a plurality of frequencies; and an arithmetic module configured to generate a respective oscillator tuning word (OTW) based on each X, the DCO generating a respective frequency based on each OTW.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

This written description and the following claims may include terms, such as "on," that are used for descriptive purposes only and are not to be construed as limiting. The embodiments of a system, PLL, and/or DCO described herein can be manufactured, used, or shipped in a number of configurations.

What is claimed is:

1. A method for controlling a digitally controlled oscillator (DCO), the method comprising:
 fitting a respective polynomial approximation to each of multiple segments of a nonlinear function of frequency; and
 generating a first control signal based on the polynomial approximation of one of the segments, wherein the DCO is configured to receive a first oscillator tuning word (OTW) generated based on a received tuning word and the first control signal.

2. The method of claim 1, wherein the tuning word is a first normalized tuning word (NTW), the method further comprising:
 multiplying the first NTW by the first control signal to obtain the first OTW; and
 inputting the first OTW to the DCO to cause the DCO to hop to a first channel corresponding to the first NTW and the first control signal, wherein the first control signal is generated based on a reference frequency and a linear interpolation of the nonlinear function at a first frequency, and the first frequency corresponds to the first channel.

3. The method of claim 2, wherein the reference frequency is the frequency of a second channel.

4. The method of claim 1, wherein the respective polynomial approximation to each of the multiple segments of the nonlinear function of frequency is a linear approximation.

5. The method of claim 2, further comprising:
 generating a second NTW corresponding to a second channel;
 generating a second control signal based on the nonlinear function of frequency at a second frequency corresponding to the second channel or based on an estimate of the nonlinear function of frequency at the second frequency;
 multiplying the second NTW by the second control signal to obtain a second OTW; and
 inputting the second OTW to the DCO to cause the DCO to hop to the second channel.

6. The method of claim 1, wherein at least part of the method is performed in an all-digital phase locked loop (ADPLL).

7. The method of claim 2, wherein the linear interpolation is based on a center point of the nonlinear function of frequency.

8. The method of claim 1, wherein the nonlinear function of frequency is a cubic function of frequency.

9. The method of claim 2, wherein the linear interpolation is based on:

$$ y = y_0 + \frac{dy_0}{df}(f - f_0) = y_0\left(1 - 3\frac{f - f_0}{f_0}\right) $$

in which y corresponds to a change in DCO gain variation, f0 corresponds to a frequency at which the DCO gain variation is 100%, and y0 corresponds to the value of the change in DCO gain variation at which the gain variation is 100%.

10. A system for controlling a digitally controlled oscillator (DCO), the system comprising:
 a circuit configured to fit a respective polynomial approximation to each of multiple segments of a nonlinear function of frequency, and to generate a plurality of control signals, each control signal being based on the polynomial approximation at a respective frequency,
 wherein the DCO is configured to receive a plurality of oscillator tuning words (OTWs) and each OTW is generated based on one selected from the control signals being stored and a respective tuning word and a respective control signal.

11. The system of claim 10, further comprising:
 the DCO; and
 an arithmetic module configured to generate the plurality of OTWs, wherein the first circuit is a phase-locked loop (PLL) and each control signal is also based on a reference frequency.

12. The system of claim 11, wherein at least one of the circuit and the arithmetic module is provided as part of a normalized DCO comprising the DCO, wherein the DCO is configured to hop among a plurality of channels based on the plurality of OTWs.

13. The system of claim 10, wherein each control signal is based on a linear interpolation of a nonlinear function of frequency at a respective frequency and the linear interpolation is based on a center point of the nonlinear function of frequency.

14. The system of claim 10, wherein the nonlinear function of frequency is a cubic function of frequency.

15. The system of claim 13, wherein the linear interpolation is based on:

$$ y = y_0 + \frac{dy_0}{df}(f - f_0) = y_0\left(1 - 3\frac{f - f_0}{f_0}\right) $$

in which y corresponds to a change in DCO gain variation, f0 corresponds to a frequency at which the DCO gain variation is 100%, and y0 corresponds to the value of the change in DCO gain variation at which the gain variation is 100%.

16. The system of claim 13, wherein the linear interpolation is based on a value of a change in DCO gain variation.

17. The system of claim 13, wherein the linear interpolation is based on at least one of a frequency at which DCO gain variation is 100% and a value of a change in DCO gain variation at which the DCO gain variation is 100%.

18. A system configured to be coupled to a digitally controlled oscillator (DCO), the system comprising:
 a circuit configured to fit a respective polynomial approximation to each of multiple segments of a nonlinear function of frequency, and to generate a plurality of control signals, each control signal being based on the polynomial approximation at a respective frequency,
 wherein the DCO is configured to receive a plurality of oscillator tuning words (OTWs) and each OTW is generated based on a respective tuning word and a respective control signal.

19. The system of claim 18, further comprising:
 the DCO; and
 an arithmetic module configured to receive a plurality of the tuning words each corresponding to a respective channel, and further configured to generate a respective OTW based on each control signal, wherein each control signal is based on a reference frequency and a linear interpolation of the nonlinear function of frequency at the respective frequency.

20. The system of claim 19, wherein the linear interpolation is based on a center point of a frequency range.

* * * * *